(12) United States Patent
Chen et al.

(10) Patent No.: US 8,963,605 B2
(45) Date of Patent: Feb. 24, 2015

(54) MULTI-PHASE CLOCK SIGNAL GENERATION CIRCUITS

(75) Inventors: Weiwei Chen, Beijing (CN); Lan Chen, Beijing (CN); Shuang Long, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 195 days.

(21) Appl. No.: 13/574,229

(22) PCT Filed: Nov. 30, 2011

(86) PCT No.: PCT/CN2011/083212
§ 371 (c)(1),
(2), (4) Date: Jul. 19, 2012

(87) PCT Pub. No.: WO2013/078636
PCT Pub. Date: Jun. 6, 2013

(65) Prior Publication Data
US 2013/0135020 A1    May 30, 2013

(51) Int. Cl.
*H03K 3/00*    (2006.01)
*G06F 1/04*    (2006.01)

(52) U.S. Cl.
USPC ............................ 327/295; 327/293; 327/291

(58) Field of Classification Search
USPC .......... 327/291–296, 246, 247, 266, 274, 287
See application file for complete search history.

(56) References Cited

U.S. PATENT DOCUMENTS 6,525,581 B1 * 2/2003 Choi .............................. 327/175
7,312,647 B2 * 12/2007 Choi et al. ..................... 327/175

FOREIGN PATENT DOCUMENTS

| CN | 101572546 A | 11/2009 |
|---|---|---|
| CN | 101630955 A | 1/2010 |
| JP | 2006014352 A | 1/2006 |

* cited by examiner

*Primary Examiner* — Hai L Nguyen
(74) *Attorney, Agent, or Firm* — Kinney & Lange, P.A.

(57) ABSTRACT

Disclosed is a multi-phase clock signal generation circuit including two circuit blocks, each of which includes a cross-coupled structure and two delay units, and the delay units are adjustable. One circuit block (MD1) includes two NMOS transistors, two PMOS transistors, and two delay units, and the other circuit block (MD2) may include two NMOS transistors, two PMOS transistors, and two delay units. The circuit can generate clock signals with respective phases whose relationship is relatively independent of integration process, operating voltage and temperature, thereby allowing guaranteed efficiency for a multi-phase charge pump.

12 Claims, 4 Drawing Sheets

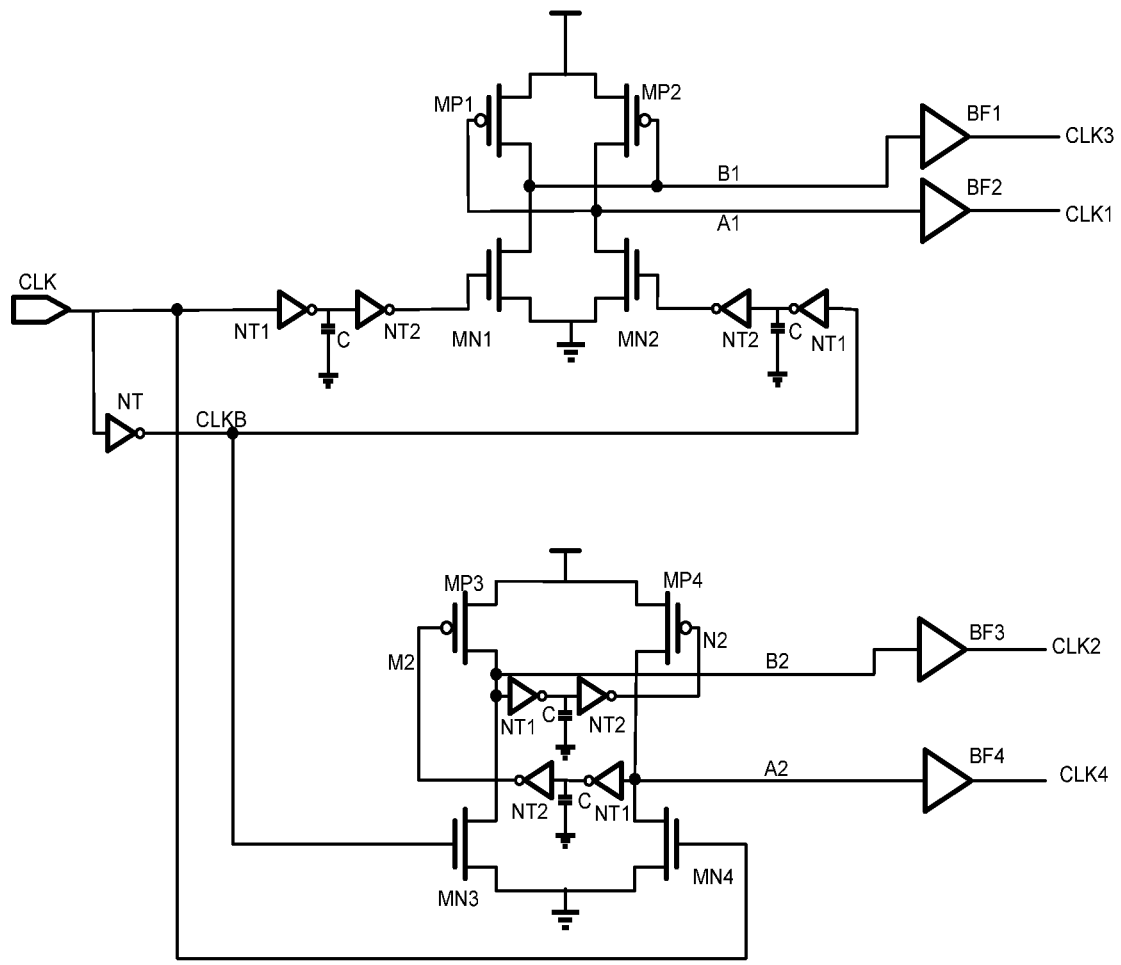
Fig. 6
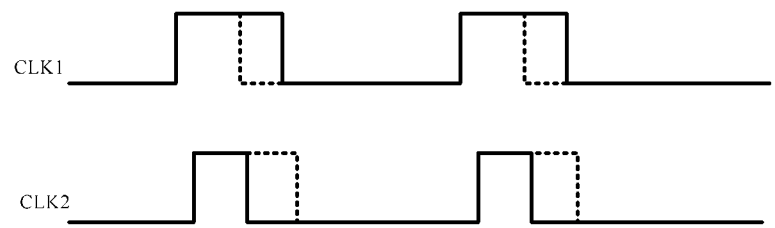
Fig. 7 *Prior art*

MULTI-PHASE CLOCK SIGNAL GENERATION CIRCUITS

CROSS-REFERENCE TO RELATED APPLICATION

This application is a National Phase application of, and claims priority to, PCT Application No. PCT/CN2011/083212, filed on Nov. 30, 2011, entitled "Multi-phase Clock Signal Generation Circuits", which is incorporated herein by reference in its entirety.

TECHNICAL FIELD

The present disclosure relates to electronic circuits, and in particular to multi-phase clock signal generation circuits.

BACKGROUND

Multi-phase clock signal generation circuits are widely used in integrated circuits, and serve as important components of multi-phase charge pumps. Conventionally, a multi-phase clock signal is generated by a combination of delayed clock signals. In such conventional multi-phase clock generator, characteristics of elements in the clock generator, such as MOS transistor, resistor, may vary significantly with changes in integration process, operating voltage or operating temperature. Clock phases which depend on these elements may be accordingly advanced or delayed, and some of the phases may even overlap with each other. As shown in FIG. 7, the solid lines denote normal waveforms of clock signals CLK1, CLK2, and the dashed lines denote potential changes in the waveforms of clock signals CLK1, CLK2 with fluctuations in integration process, operating voltage or operating temperature. As can be seen from FIG. 7, the phases of the clock signals overlap with each other. In the case that the conventional multi-phase clock generator is used in a multi-phase charge pump, the efficiency of the multi-phase charge pump would be considerably reduced when there is fluctuation in integration process, operating voltage or operating temperature.

SUMMARY

In order to address one or more technical problems according to prior art, it provides a multi-phase clock signal generation circuit.

According to an embodiment of the present disclosure, a multi-phase clock signal generation circuit comprises:

first transistor and second transistor of a first channel type;

third transistor and fourth transistor of a second channel type, wherein sources of the first transistor and the second transistor are grounded, a drain of the first transistor is coupled to a source of the third transistor and a gate of the fourth transistor, a drain of the second transistor is coupled to a source of the fourth transistor and a gate of the third transistor, and drains of the third transistor and the fourth transistor are coupled to a power supply;

a first delay unit having an input for receiving a clock signal and an output coupled to a gate of the first transistor;

a second delay unit having an input for receiving an inverted clock signal of the clock signal and an output coupled to a gate of the second transistor;

fifth transistor and sixth transistor of the first channel type which receive the inverted clock signal and the clock signal, respectively;

seventh transistor and eighth transistor of the second channel type, wherein sources of the fifth transistor and the sixth transistor are grounded, a drain of the fifth transistor is coupled to a source of the seventh transistor, a drain of the sixth transistor is coupled to a source of the eighth transistor, and drains of the seventh transistor and the eighth transistor are coupled to the power supply;

a third delay unit having an input coupled to a node between the drain of the fifth transistor and the source of the seventh transistor, and an output coupled to a gate of the eighth transistor;

a fourth delay unit having an input coupled to a node between the drain of the sixth transistor and the source of the eighth transistor, and an output coupled to a gate of the seventh transistor;

wherein a first clock signal is outputted at a node between the drain of the second transistor and the source of the fourth transistor, a second clock signal is outputted at a node between the drain of the fifth transistor and the source of the seventh transistor, a third clock signal is outputted at a node between the drain of the first transistor and the source of the third transistor, and a fourth clock signal is outputted at a node between the drain of the sixth transistor and the source of the eighth transistor.

In an embodiment, the first delay unit, the second delay unit, the third delay unit and the fourth delay unit each have an adjustable amount of delay.

In an embodiment, each of the first delay unit, the second delay unit, the third delay unit and the fourth delay unit comprises first inverter and second inverter connected in series, and a capacitor having one of its terminals connected to a node between the first inverter and the second inverter and the other terminal grounded.

In an embodiment, the capacitor is an adjustable capacitor.

In an embodiment, the first delay unit and the second delay unit have substantially equal amounts of delay, and the third delay unit and the fourth delay unit have substantially equal amounts of delay.

In an embodiment, the first channel type is N-type, and the second channel type is P-type.

In an embodiment, the first channel type is P-type, and the second channel type is N-type.

In an embodiment, the circuit further comprises:

a first buffer having an input coupled to a node between the drain of the first transistor and the source of the third transistor, and an output for outputting a buffered version of the third clock signal;

a second buffer having an input coupled to a node between the drain of the second transistor and the source of the fourth transistor, and an output for outputting a buffered version of the first clock signal;

a third buffer having an input coupled to a node between the drain of the fifth transistor and the source of the seventh transistor, and an output for outputting a buffered version of the second clock signal; and a fourth buffer having an input coupled to a node between the drain of the sixth transistor and the source of the eighth transistor, and an output for outputting a buffered version of the fourth clock signal.

In an embodiment, the circuit further comprises an inverter configured to invert the input clock signal to the inverted clock signal.

According to a further embodiment of the present disclosure, a dual-phase clock signal generation circuit comprises:

first transistor and second transistor of a first channel type;

third transistor and fourth transistor of a second channel type, wherein sources of the first transistor and second transistor are grounded, a drain of the first transistor is coupled to a source of the third transistor and a gate of the fourth transistor, a drain of the second transistor is coupled to a source of the fourth transistor and a gate of the third transistor, and drains of the third transistor and fourth transistor are coupled to a power supply;

a first delay unit having an input for receiving a clock signal and an output coupled to a gate of the first transistor;

a second delay unit having an input for receiving an inverted clock signal of the clock signal and an output coupled to a gate of the second transistor;

wherein a first clock signal is outputted at a node between the drain of the second transistor and the source of the fourth transistor, and a third clock signal is outputted at a node between the drain of the first transistor and the source of the third transistor.

According to a yet further embodiment of the present disclosure, a dual-phase clock signal generation circuit comprises:

first transistor and second transistor of a first channel type which receive a clock signal and an inverted clock signal of the clock signal, respectively;

third transistor and fourth transistor of a second channel type, wherein sources of the first transistor and the second transistor are grounded, a drain of the first transistor is coupled to a source of the third transistor, a drain of the second transistor is coupled to a source of the fourth transistor, and drains of the third transistor and the fourth transistor are coupled to a power supply;

a first delay unit having an input coupled to a node between the drain of the first transistor and the source of the third transistor, and an output coupled to a gate of the fourth transistor;

a second delay unit having an input coupled to a node between the drain of the second transistor and the source of the fourth transistor, and an output coupled to a gate of the third transistor;

wherein a first clock signal is outputted at a node between the drain of the first transistor and the source of the third transistor, and a second clock signal is outputted at a node between the drain of the second transistor and the source of the fourth transistor.

The multi-phase clock signal generation circuits of the embodiments of the present disclosure can generate clock signals with respective phases whose relationship is relatively independent of integration process, operating voltage and operating temperature, thereby allowing guaranteed efficiency for a multi-phase charge pump.

In addition, the multi-phase clock signal generation circuits of the embodiments of the present disclosure can generate clock signals of which the phase delay is adjustable. Further, the multi-phase clock signal generation circuits of the embodiments of the present disclosure have low power consumption.

BRIEF DESCRIPTION OF THE DRAWINGS

The above features and advantages of the present disclosure will be more apparent from the following detailed description in conjunction with accompanying drawings in which:

FIG. 6 is a schematic diagram showing a circuit structure of a quad-phase clock signal generator according to a yet further embodiment of the present disclosure.

FIG. 7 shows a relationship between multi-phase clocks generated by a conventional multi-phase clock signal generator.

DETAILED DESCRIPTION OF THE PREFERRED EMBODIMENTS

Hereafter, embodiments of the present disclosure will be described in detail with reference to the figures. It will be readily understood that the following detailed description of embodiments is not intended to limit the scope of the present disclosure. The scope of the present disclosure is defined by the appended claims, and various alternatives, modifications and equivalents which come within the spirit and scope of the claims are to be embraced within the scope of the present disclosure.

For a better understanding of the present disclosure, many specific details are illustrated in the following description, such as specific circuit, device, connection and the like. It will be readily understood that the present invention can be implemented without these details. In some embodiments, description of well-known techniques is omitted to avoid obscuring the idea of the present disclosure.

The particular embodiments described in the following represent exemplary embodiments of the present disclosure, and are to be considered in all respects only as illustrative and not restrictive. Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment, or exclude any other or varied embodiments. All features in the present disclosure or steps in all the disclosed method or process may be combined in any manner, except mutually exclusive features and/or steps. It will be readily understood that the figures are intended for illustration, and are not necessarily drawn to scale. Reference to an element being "connected" or "coupled" to another element may mean that the element is directly connected or coupled to the another element, or there may exist any intervening element. Conversely, when an element is referred to as "directly connected" or "directly coupled" to another element, no intervening element exists. Like reference signs throughout the figures refer to like elements. The term "and/or" used here encompasses any and all combinations of one or more listed items.

Figure 1:
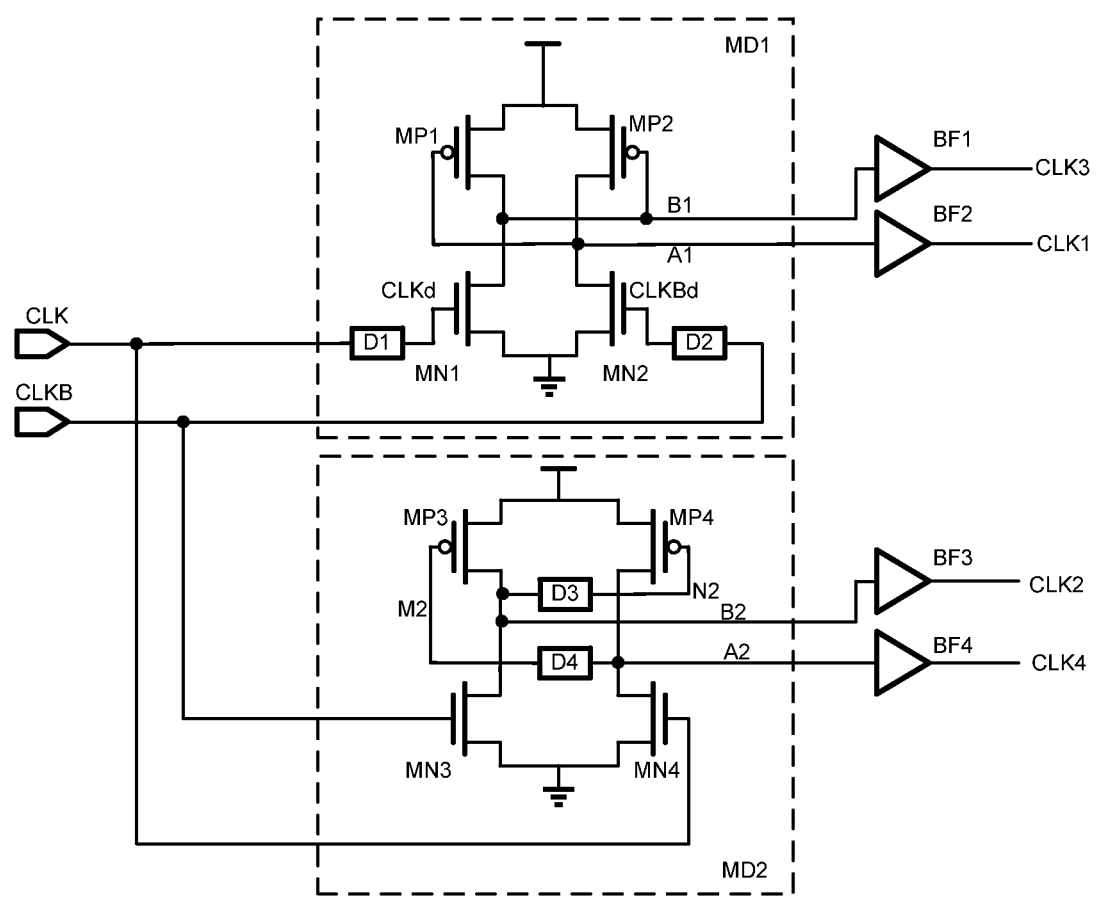
FIG. 1 is a schematic diagram showing a circuit structure of a multi-phase clock signal generator according to an embodiment of the present disclosure.

FIG. 1 is a schematic diagram showing a circuit structure of a multi-phase clock signal generator according to an embodiment of the present disclosure. The quad-phase clock signal generator may include two circuit blocks MD1 and MD2 as shown in FIG. 1. Each of the two circuit blocks may include a cross-coupled structure and delay units, and the time delay of each of the delay units D1, D2 is adjustable.

As shown in FIG. 1, the circuit block MD1 may include NMOS transistors MN1, MN2, PMOS transistors MP1, MP2, and two delay units D1, D2. The circuit block MD2 may include NMOS transistors MN3, MN4, PMOS transistors MP3, MP4, and two delay units D3, D4.

The delay unit D1 may receive an input clock signal CLK at its input, and output a delayed clock signal at its output. The output of the delay unit D1 may be coupled to the gate of NMOS transistor MN1.

The delay unit D2 may receive an inverted clock signal CLKB at its input, and output a delayed clock signal at its output. The output of the delay unit D2 may be coupled to the gate of NMOS transistor MN2.

NMOS transistors MN1, MN2 may have their sources grounded, and their drains coupled to the sources of PMOS transistor MP1, MP2, respectively. A node between the drain of NMOS transistor MN2 and the source of PMOS transistor MP2 may be coupled to the gate of PMOS transistor MP1, and may act as a node at which a signal is outputted with a respective phase from the quad-phase clock signal generator according to the present embodiment. A node between the drain of NMOS transistor MN1 and the source of PMOS transistor MP1 may be coupled to the gate of PMOS transistor MP2, and may act as a node at which a signal is outputted with another phase from the quad-phase clock signal generator according to the present embodiment. The drains of PMOS transistors MP1, MP2 may be coupled to a power supply.

NMOS transistor MN3 may receive the inverted clock signal CLKB at its gate, and NMOS transistor MN4 may receive the input clock signal CLK at its gate. NMOS transistors MN3, MN4 may have their sources grounded, and their drains coupled to the sources of PMOS transistor MP3, MP4, respectively. A node between the drain of NMOS transistor MN4 and the source of PMOS transistor MP4 may be coupled to the gate of PMOS transistor MP3 via the fourth delay unit D4, and may act as a node at which a signal is outputted with a further phase from the quad-phase clock signal generator according to the present embodiment. The drains of PMOS transistors MP3, MP4 may be coupled to the power supply.

A clock signal B1 outputted at the node between the drain of NMOS transistor MN1 and the source of PMOS transistor MP1 may be buffered by a buffer BF1, and then outputted as a clock signal CLK3. A clock signal A1 outputted at the node between the drain of NMOS transistor MN2 and the source of PMOS transistor MP2 may be buffered by a buffer BF2, and then outputted as a clock signal CLK1. A clock signal B2 outputted at the node between the drain of NMOS transistor MN3 and the source of PMOS transistor MP3 may be buffered by a buffer BF3, and then outputted as a clock signal CLK2. A clock signal A2 outputted at the node between the drain of NMOS transistor MN4 and the source of PMOS transistor MP4 may be buffered by a buffer BF4, and then outputted as a clock signal CLK4.

A person skilled in the art will appreciate that the channel types of MOS transistors in the above embodiment are not intended for limiting, and variations may be made. For example, in the cross-coupled structure, the upper two MOS transistors may be of N-type, while the lower two MOS transistors may be of P-type.

In the above embodiment, the sources of NMOS transistors MN1, MN2 are grounded, and the drains of PMOS transistors MP1, MP2 are coupled to the power supply. A person skilled in the art will appreciate that this is only an example, and the power supply configuration of the cross-coupled structure may be adapted in accordance with requirements of different applications, such as voltage, current and/or heat dissipation.

In another embodiment, each of the delay units D1 to D4 may have an adjustable amount of delay. For example, the amount of delay of the delay unit D1 may be substantially equal to that of the delay unit D2, and the amount of delay of the delay unit D3 may be substantially equal to that of the delay unit D4.

Figure 2:
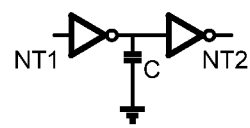
FIG. 2 is a schematic diagram showing a circuit structure of a delay unit in the multi-phase clock signal generator according to an embodiment of the present disclosure.

FIG. 2 is a schematic diagram showing a circuit structure of a delay unit in the multi-phase clock signal generator according to an embodiment of the present disclosure. The delay unit as shown in FIG. 2 may include two inverters NT1, NT2 connected in series, and a capacitor C having one of its terminals coupled to a node between the inverters and the other terminal grounded. In a further embodiment, a person skilled in the art may appreciate that more inverters may be provided for delay, or other approaches may be adopted for delay, such as using delay chain.

Figure 8:
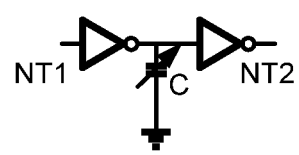
FIG. 8 is a schematic diagram illustrating an example of an adjustable capacitor for use in a delay unit of a multi-phase clock signal generator according to some embodiments of the present disclosure.

In an embodiment, the capacitor C in each of the delay units D1, D2 may have adjustable capacitance. For example, the capacitor C may be an adjustable capacitor, as illustrated in FIG. 8.

Figure 3:
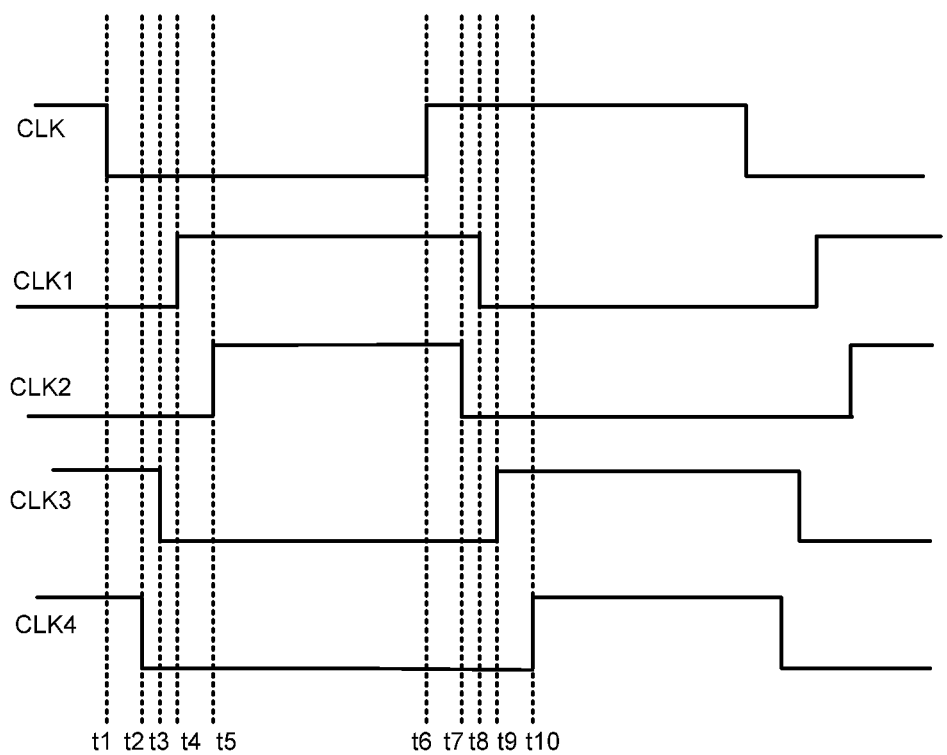
FIG. 3 is a schematic diagram showing a relative timing relationship between signals with respective phases outputted from the multi-phase clock signal generator according to an embodiment of the present disclosure.

FIG. 3 is a schematic diagram showing a relative timing relationship between signals with respective phases outputted from the multi-phase clock signal generator according to an embodiment of the present disclosure.

As shown in FIG. 3, the input clock signals CLK, CLKB may be a pair of clock signals with opposite phases. Clock signals CLKd, CLKBd are signals obtained by delaying the clock signals CLK, CLKB via the delay units D1, D2. CLK1, CLK2, CLK3, CLK4 denote clock signals with respective phases obtained by buffering, via the buffers BF2, BF3, BF1, BF4, respectively, the clock signals outputted from the quad-phase clock signal generator of FIG. 1. At time t1, a falling edge of the input clock signal CLK arrives. At time t2, PMOS transistor MP4 sets the signal A2 to a high level, while the clock signal CLK 4 is changed to a low level. At time t3, a falling edge of the clock signal CLKd arrives, the clock signal B1 is pulled down to a low level via the transistor MN1, while the clock signal CLK3 is changed to a low level. At time t4, the clock signal B1 pulls up the clock signal A1 to a high level via the cross-coupled PMOS transistors MP1, MP2, while the clock signal CLK1 is changed to a high level. At time t5, the clock signal A2 pulls up the clock signal B2 to a high level via the cross-coupled PMOS transistors MP3, MP4, while the clock signal CLK2 is changed to a high level.

At time t6, a rising edge of the input clock signal CLK arrives. At time t7, the clock signal B2 is pulled down to a low level via NMOS transistor MN3, while the clock signal CLK2 is changed to a low level. At time t8, a falling edge of the clock signal CLKBd arrives, the clock signal A1 is pulled down to a low level via NMOS transistor MN2, while the clock signal CLK1 is changed to a low level. At time t9, the clock signal A1 pulls up the clock signal B1 to a high level via the cross-coupled PMOS transistors MP1, MP2, while the clock signal CLK3 is changed to a high level. At time t10, the clock signal B2 pulls up the clock signal A2 to a high level via the cross-coupled PMOS transistors MP3, MP4, while the clock signal CLK4 is changed to a high level.

Figure 4:
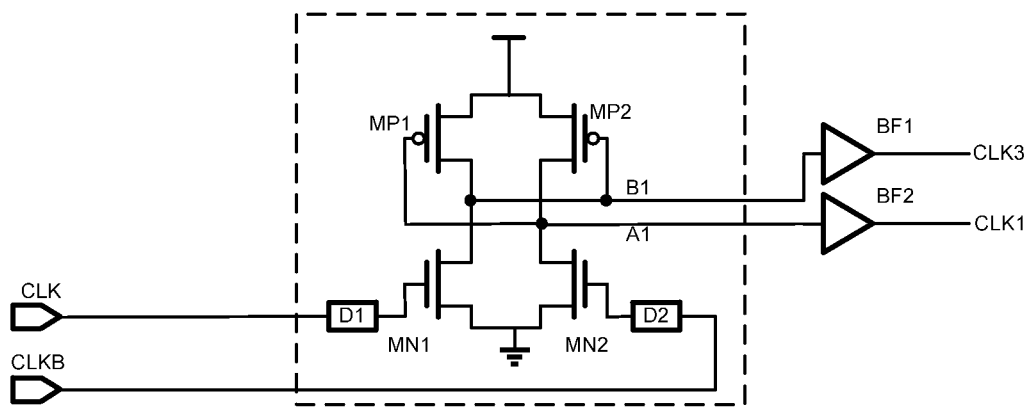
FIG. 4 is a schematic diagram showing a circuit structure of a dual-phase clock signal generator according to another embodiment of the present disclosure.

The foregoing description is directed to a quad-phase clock signal generation circuit, while a person skilled in the art will appreciate that dual-phase clock signals may be generated using a dual-phase structure contained in the circuit. FIG. 4 is a schematic diagram showing a circuit structure of a dual-phase clock signal generator according to another embodiment of the present disclosure. As shown in FIG. 4, the dual-phase clock signal generator may utilize the circuit block MD1 and the corresponding buffers BF1, BF2 in the quad-phase clock signal generator of FIG. 1. The dual-phase clock signal generator according to the present embodiment may generate the clock signals CLK3, CLK1.

Figure 5:
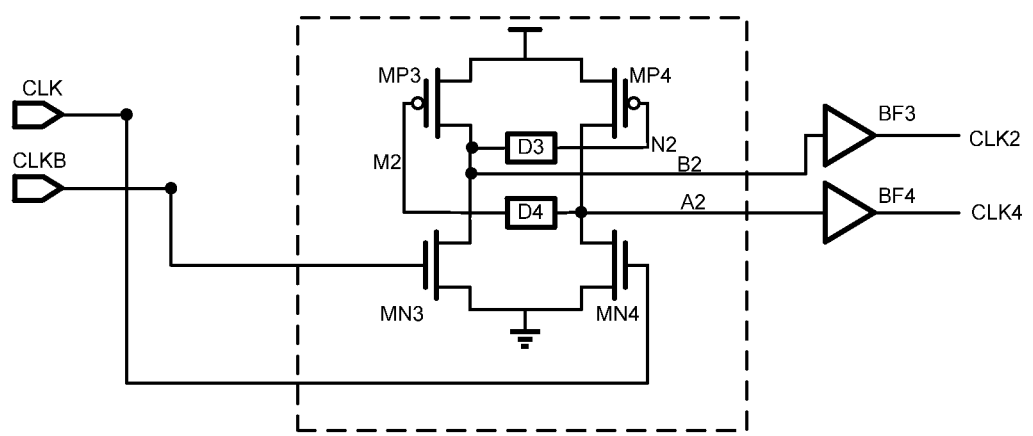
FIG. 5 is a schematic diagram showing a circuit structure of a dual-phase clock signal generator according to a further embodiment of the present disclosure.

FIG. 5 is a schematic diagram showing a circuit structure of a dual-phase clock signal generator according to a further embodiment of the present disclosure. As shown in FIG. 5, the dual-phase clock signal generator may utilize the circuit block MD2 and the respective buffers BF3, BF4 in the quad-phase clock signal generator of FIG. 1. The dual-phase clock signal generator according to the present embodiment may generate the clock signals CLK2, CLK4.

Although the foregoing describes generations of dual-phase and quad-phase clock signals, a person skilled in the art will appreciate that the above embodiments may be used to generate clock signals having other numbers of phases. For example, tri-phase or quinary-phase clock signals may be generated by passing the input clock signal(s) through a through transistor structure and using the signal(s) as additional clock signals. As another example, an additional dual-phase clock signal generation circuit may be added to the quad-phase clock signal generator of FIG. 1, and additional delay units may be provided to the additional dual-phase clock signal generation circuit. For example, each of the delay unit in FIG. 4 or 5 may be replaced with two delay units. Alternatively, clock signals with a desired number of phases may be generated by dividing a single clock signal and then using the described clock signal generation circuits to process the divided signals.

Although the foregoing describes that the clock signal generation circuit receives externally inputted clock signal and inverted clock signal, the described circuit may receive a single clock signal inputted from the external or generated by a built-in clock source, and may be provided with a inverter to invert the input clock signal and thus obtain an inverted clock signal. FIG. 6 is a schematic diagram showing a circuit structure of a quad-phase clock signal generator according to a yet further embodiment of the present disclosure.

As shown in FIG. 6, a single clock signal CLK may be inputted externally, and inverted by an inverter NT built in the circuit to generate an inverted clock signal CLKB. Further, in the circuit shown in FIG. 6, the respective delay units of FIG. 1 are each replaced with the delay unit of FIG. 2, while the capacitance of the capacitor C may be adjustable as required.

As the operating process described above, the respective phases of the clock signals generated by the circuit structures according to the embodiments of the present disclosure have been triggered in a strict order and under a tight timing constraint, and thus no overlap will occur. That is, the relationship between the respective phases is relatively independent from integration process, operating voltage or temperature.

The foregoing description of the exemplary embodiments of the present disclosure, including the abstract, is not intended to be exclusive or limiting the present disclosure to some specific form. The particular embodiments are described for illustrating the present disclosure, and various equivalents and modification are possible without departing from the spirit and scope of the present disclosure. It will be readily understood that particular signal, current, frequency, power range, time and the like are given merely for illustration, and other values can also be used in other embodiments or examples of the present disclosure.

What is claimed is:

1. A multi-phase clock signal generation circuit, comprising:
    first transistor and second transistor of a first channel type;
    third transistor and fourth transistor of a second channel type, wherein sources of the first transistor and second transistor are grounded, a drain of the first transistor is coupled to a source of the third transistor and a gate of the fourth transistor, a drain of the second transistor is coupled to a source of the fourth transistor and a gate of the third transistor, and drains of the third transistor and the fourth transistor are coupled to a power supply;
    a first delay unit having an input for receiving a clock signal and an output coupled to a gate of the first transistor;
    a second delay unit having an input for receiving an inverted clock signal of the clock signal and an output coupled to a gate of the second transistor;
    wherein a first clock signal is outputted at a node between the drain of the second transistor and the source of the fourth transistor, and a third clock signal is outputted at a node between the drain of the first transistor and the source of the third transistor.

2. The multi-phase clock signal generation circuit of claim 1, further comprising:
    fifth transistor and sixth transistor of the first channel type which receive the inverted clock signal and the clock signal, respectively;
    seventh transistor and eighth transistor of the second channel type, wherein sources of the fifth transistor and the sixth transistor are grounded, a drain of the fifth transistor is coupled to a source of the seventh transistor, a drain of the sixth transistor is coupled to a source of the eighth transistor, and drains of the seventh transistor ad the eighth transistor are coupled to the power supply;
    a third delay unit having an input coupled to a node between the drain of the fifth transistor and the source of the seventh transistor, and an output coupled to a gate of the eighth transistor; and
    a fourth delay unit having an input coupled to a node between the drain of the sixth transistor and the source of the eighth transistor, and an output coupled to a gate of the seventh transistor;
    wherein a second clock signal is outputted at a node between the drain of the fifth transistor and the source of the seventh transistor and a fourth clock signal is outputted at a node between the drain of the sixth transistor and the source of the eight transistor.

3. The circuit of claim 2, wherein the first delay unit, the second delay unit, the third delay unit and the fourth delay unit each have an adjustable amount of delay.

4. The circuit of claim 2, wherein each of the first delay unit, the second delay unit, the third delay unit and the fourth delay unit comprises first inverter and second inverter connected in series, and a capacitor having one of its terminals connected to a node between the first inverter and the second inverter and the other terminal grounded.

5. The circuit of claim 4, wherein the capacitor is an adjustable capacitor.

6. The circuit of claim 2, wherein the first delay unit and the second delay unit have substantially equal delay time, and the third delay unit and the fourth delay unit have substantially equal amounts of delay.

7. The circuit of claim 2, wherein the first channel type is N-type, and the second channel type is P-type.

8. The circuit of claim 2, wherein the first channel type is P-type, and the second channel type is N-type.

9. The circuit of claim 2, further comprising:
- a first buffer having an input coupled to a node between the drain of the first transistor and the source of the third transistor, and an output for outputting a buffered version of the third clock signal;
- a second buffer having an input coupled to a node between the drain of the second transistor and the source of the fourth transistor, and an output for outputting a buffered version of the first clock signal;
- a third buffer having an input coupled to a node between the drain of the fifth transistor and the source of the seventh transistor, and an output for outputting a buffered version of the second clock signal; and
- a fourth buffer having an input coupled to a node between the drain of the sixth transistor and the source of the eighth transistor, and an output for outputting a buffered version of the fourth clock signal.

10. The circuit of claim 2, further comprising an inverter for inverting the input clock signal to the inverted clock signal.

11. The circuit of claim 1, wherein each of the first delay unit and the second delay unit comprises first inverter and second inverter connected in series, and a capacitor having one of its terminals connected to a node between the first inverter and the second inverter and the other terminal grounded.

12. The circuit of claim 11, wherein the capacitor is an adjustable capacitor.

\* \* \* \* \*

UNITED STATES PATENT AND TRADEMARK OFFICE
CERTIFICATE OF CORRECTION

Page 1 of 1

PATENT NO. : 8,963,605 B2
APPLICATION NO. : 13/574229
DATED : February 24, 2015
INVENTOR(S) : Chen et al.

It is certified that error appears in the above-identified patent and that said Letters Patent is hereby corrected as shown below:

In the Claims,

Col. 8, Line 35
 Delete "ad"
 Insert --and--

Col. 8, Line 49
 Delete "eight"
 Insert --eighth--

Signed and Sealed this
Seventh Day of July, 2015

Michelle K. Lee
*Director of the United States Patent and Trademark Office*